(12) United States Patent
Saruki et al.

(10) Patent No.: US 11,313,922 B2
(45) Date of Patent: Apr. 26, 2022

(54) SIGNAL PROCESSING CIRCUIT AND MAGNETIC SENSOR SYSTEM

(71) Applicant: TDK CORPORATION, Tokyo (JP)

(72) Inventors: Shunji Saruki, Tokyo (JP); Shinichirou Mochizuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 67 days.

(21) Appl. No.: 16/736,882

(22) Filed: Jan. 8, 2020

(65) Prior Publication Data

US 2020/0256933 A1 Aug. 13, 2020

(30) Foreign Application Priority Data

Feb. 13, 2019 (JP) .............................. JP2019-023208

(51) Int. Cl.
*G01R 33/09* (2006.01)
(52) U.S. Cl.
CPC .................................... *G01R 33/09* (2013.01)
(58) Field of Classification Search
CPC ................ G01R 33/09; G01R 33/0029; G01R 33/0094; G01D 5/145; G01D 5/2449; G01D 3/022; G01D 5/12; G01P 3/487
See application file for complete search history.

(56) References Cited

U.S. PATENT DOCUMENTS

| | | | | |
|---|---|---|---|---|
| 5,646,868 A | * | 7/1997 | Ueda ....................... | G06F 17/12 |
| | | | | 702/85 |
| 10,571,308 B2 | | 2/2020 | Mochizuki | |
| 2018/0172481 A1 | * | 6/2018 | Mochizuki ............... | G01D 5/16 |
| 2019/0298202 A1 | * | 10/2019 | Nakamura ......... | G01R 33/0094 |

FOREIGN PATENT DOCUMENTS

| | | |
|---|---|---|
| JP | 2011-47841 A | 3/2011 |
| JP | 2012-237682 A | 12/2012 |
| JP | 2016-053547 A | 4/2016 |
| JP | 6319601 B1 | 5/2018 |

OTHER PUBLICATIONS

Feb. 2, 2021 Office Action issued in Japanese Patent Application 2019-023208.

* cited by examiner

*Primary Examiner* — Tarun Sinha
*Assistant Examiner* — Yossef Korang-Beheshti
(74) *Attorney, Agent, or Firm* — Oliff PLC

(57) ABSTRACT

A signal processing circuit includes a correction function determination section for performing correction function determination processing, and a correction processing section for performing correction processing. The correction processing is to correct first and second detection signals by using a correction function to thereby generate first and second corrected signals. The correction function is expressed as a coefficient matrix for converting a first column vector containing the first and second detection signals as elements into a second column vector containing the first and second corrected signals as elements. The correction function determination processing includes performing arithmetic processing using a plurality of pairs of values of the first and second detection signals to determine one or two provisional correction coefficients as the correction coefficients of the correction function.

3 Claims, 7 Drawing Sheets

SIGNAL PROCESSING CIRCUIT AND MAGNETIC SENSOR SYSTEM

BACKGROUND OF THE INVENTION

1. Field of the Invention

The present invention relates to a magnetic sensor system including a plurality of magnetic sensors that detect components in a plurality of directions of an external magnetic field, and to a signal processing circuit for use with the magnetic sensor system.

2. Description of the Related Art

Magnetic sensors for detecting a component in one direction of an external magnetic field have recently been used in a variety of applications. A type of magnetic sensor is known that incorporates at least one magnetic detection element provided on a substrate. An example of the magnetic detection element is a magnetoresistive element.

The magnetic sensor for detecting a component in one direction of an external magnetic field generates a detection signal corresponding to the component in the one direction of the external magnetic field. The one direction in this context will hereinafter be referred to as a sensing direction. The foregoing magnetic sensor preferably has such a characteristic that the detection signal changes in response to a change in the strength of a magnetic field in a desired direction and does not change in response to a change in the strength of the magnetic field in a direction other than the desired direction. In this context, the desired direction will be referred to as a main-axis direction, and a direction other than the desired direction will be referred to as a cross-axis direction. The sensing direction preferably coincides with the main-axis direction.

However, in a device including a plurality of magnetic sensors that detect components in a plurality of directions of an external magnetic field, the detection signal of each magnetic sensor can change in response to a change in the strength of a magnetic field in a cross-axis direction. The ratio of a change in the detection signal of the magnetic sensor to a change in the strength of the magnetic field in a cross-axis direction will be referred to as a cross-axis sensitivity. The cross-axis sensitivity becomes a cause of an error in the detection signal of the magnetic sensor.

It is thus desired that the device including a plurality of magnetic sensors be capable of applying correction to the detection signals of the plurality of magnetic sensors based on the cross-axis sensitivities of the plurality of magnetic sensors. Such a correction will hereinafter be referred to as cross-axis sensitivity correction. For example, JP 2016-053547A describes a technique for implementing cross-axis sensitivity correction.

JP 2016-053547A describes a contactless rotation angle sensor that generates a two-dimensional Hall electromotive force signal corresponding to X- and Z-axis magnetic field components. JP 2016-053547A further describes that in shipment inspection of the contactless rotation angle sensor, magnetic fields in the X- and Z-axis directions are input into the contactless rotation angle sensor to measure the two-dimensional Hall electromotive force signal, and correction parameters for use in cross-axis sensitivity correction are determined based on the measurement result.

According to conventional techniques for implementing cross-axis sensitivity correction, including the technique described in JP 2016-053547A, the detection signals of the plurality of magnetic sensors are corrected by using a correction function. The correction parameters discussed in JP 2016-053547A are parameters for determining the correction function. According to the conventional techniques, determination of the correction function requires that a dedicated magnetic field for measuring the cross-axis sensitivities of the plurality of magnetic sensors be applied to the plurality of magnetic sensors to obtain the detection signals of the plurality of magnetic sensors at that time. The conventional techniques are thus disadvantageous in that a device for generating the aforementioned dedicated magnetic field is needed and that a normal operation of the plurality of magnetic sensors needs to be interrupted in performing the processing for determining the correction function.

SUMMARY OF THE INVENTION

It is an object of the present invention to provide a signal processing circuit and a magnetic sensor system capable of implementing cross-axis sensitivity correction for at least one of a plurality of magnetic sensors, and capable of determining a correction function for implementing the cross-axis sensitivity correction without necessitating a device for generating a dedicated magnetic field and without necessitating interruption of a normal operation of the plurality of magnetic sensors.

A signal processing circuit of the present invention is configured to process a first detection signal and a second detection signal, the first detection signal and the second detection signal being generated by a magnetic sensor device and having correspondences with components of an external magnetic field that are in two mutually different directions. The signal processing circuit performs correction function determination processing to determine a correction function for correcting the first and second detection signals, and correction processing to correct the first and second detection signals by using the correction function to thereby generate first and second corrected signals.

The correction function is expressed as a coefficient matrix that is a matrix for converting a first column vector containing the first and second detection signals as elements into a second column vector containing the first and second corrected signals as elements. The coefficient matrix contains a correction coefficient $C_{ij}$ as an ith-row jth-column component, where i and j are integers that are each 1 or greater and not greater than 2.

In the signal processing circuit, a provisional correction function may be defined for the correction function determination processing. The provisional correction function is a function containing one or two provisional correction coefficients $C_{ij}$ where i and j have different values. The correction function determination processing includes obtaining a plurality of pairs of values of the first and second detection signals and performing arithmetic processing using the plurality of pairs of values of the first and second detection signals to determine the one or two provisional correction coefficients as the correction coefficient $C_{ij}$ contained in the coefficient matrix.

In the signal processing circuit of the present invention, first and second provisional corrected signal values, a provisional measurement value, a target value, and a measurement value error may be defined for the correction function determination processing. The first and second provisional corrected signal values are values of the first and second corrected signals determined from the values of the first and second detection signals by using the provisional correction function. The provisional measurement value is a sum of squares of the first and second provisional corrected signal values or a square root of the sum of the squares of the first and second provisional corrected signal values. The target value is a target value for the provisional measurement value. The measurement value error is the square of a difference between the provisional measurement value and the target value. The correction function determination processing may include maintaining the target value and performing, as the arithmetic processing using the plurality of pairs of values of the first and second detection signals, arithmetic processing to determine a value or values of the one or two provisional correction coefficients that minimizes or minimize a total sum of a plurality of measurement value errors obtained for the plurality of pairs of values of the first and second detection signals.

In the signal processing circuit of the present invention, the one or two provisional correction coefficients may be two provisional correction coefficients. In such a case, a correction coefficient $C_{11}$ and a correction coefficient $C_{22}$ may have the same value, and the two provisional correction coefficients may be a correction coefficient $C_{12}$ and a correction coefficient $C_{21}$.

In the signal processing circuit of the present invention, the one or two provisional correction coefficients may be one provisional correction coefficient. In such a case, a correction coefficient $C_{11}$ and a correction coefficient $C_{22}$ may have the same value, and one of correction coefficients $C_{12}$ and $C_{21}$ may be zero, and the other may be the one provisional correction coefficient.

A magnetic sensor system of the present invention includes the signal processing circuit of the present invention, and a magnetic sensor device. The magnetic sensor device includes a first magnetic sensor for generating the first detection signal, and a second magnetic sensor for generating the second detection signal.

According to the signal processing circuit and the magnetic sensor system of the present invention, it is possible to determine a correction function for implementing cross-axis sensitivity correction for at least one of a plurality of magnetic sensors without necessitating a device for generating a dedicated magnetic field and without necessitating interruption of a normal operation of the plurality of magnetic sensors.

Other and further objects, features and advantages of the present invention will appear more fully from the following description.

DETAILED DESCRIPTION OF THE PREFERRED EMBODIMENTS

First Embodiment

Preferred embodiments of the present invention will now be described in detail with reference to the drawings. First, a magnetic sensor system according to a first embodiment of the invention will be outlined with reference to FIG. 1 and FIG. 2. The magnetic sensor system 1 according to the present embodiment is configured to generate an angle detection value θs having a correspondence with an angle to be detected. Hereinafter, the angle to be detected will be referred to as an angle of interest.

Figure 1:
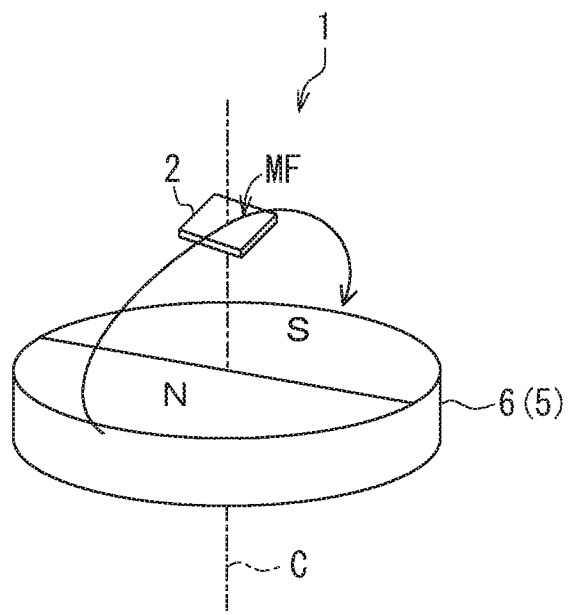
FIG. 1 is a perspective view showing a target magnetic field generator and a magnetic sensor device of a first embodiment of the invention.
Figure 2:
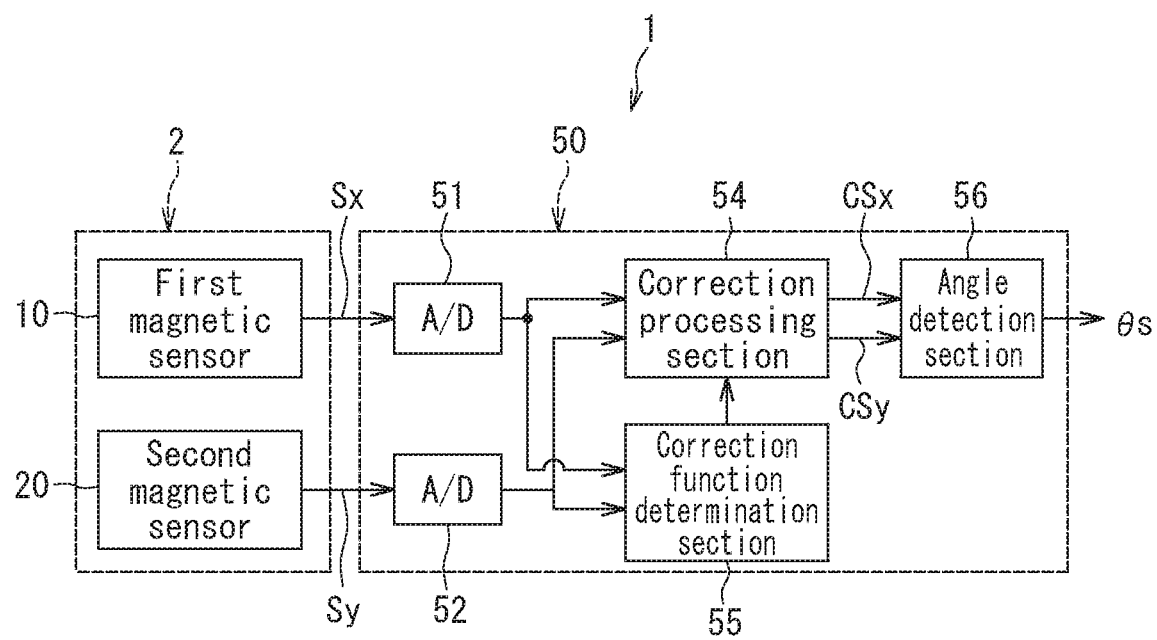
FIG. 2 is a block diagram showing a configuration of a magnetic sensor system according to the first embodiment of the invention.

As shown in FIG. 2, the magnetic sensor system 1 includes a magnetic sensor device 2 and a signal processing circuit 50. As shown in FIG. 1, the magnetic sensor system 1 further includes a target magnetic field generator 5.

The target magnetic field generator 5 generates a target magnetic field MF, which is a magnetic field to be detected by the magnetic sensor device 2. In the present embodiment, the target magnetic field MF is a magnetic field whose direction rotates with variations in the angle of interest. In the present embodiment, the target magnetic field generator 5 is a magnet 6 of a cylindrical shape having a central axis. The magnet 6 has an N pole and an S pole that are arranged symmetrically with respect to an imaginary plane including the aforementioned central axis. The magnet 6 rotates around the central axis. This causes the magnet 6 to generate the target magnetic field MF. The direction of the target magnetic field MF rotates around a center of rotation C including the central axis. In the present embodiment, the angle of interest is an angle corresponding to the rotational position of the magnet 6.

The magnetic sensor device 2 and the signal processing circuit 50 generate a value indicating a target magnetic field angle θM, as the angle detection value θs. The target magnetic field angle θM is an angle that a direction DM of the target magnetic field MF at a reference position PR in a reference plane P forms with respect to a reference direction DR. The target magnetic field angle θM has a correspondence with the angle of interest. The angle detection value θs thus has a correspondence with the angle of interest.

The magnetic sensor device 2 generates a first detection signal Sx and a second detection signal Sy that have correspondences with two components of the target magnetic field MF at the reference position PR, the two components being in mutually different directions. The target magnetic field MF at the reference position PR corresponds to an external magnetic field in the present invention. Hereinafter, the target magnetic field MF at the reference position PR will also be referred to as an external magnetic field.

As shown in FIG. 2, the magnetic sensor device 2 includes a first magnetic sensor 10 and a second magnetic sensor 20. The first magnetic sensor 10 detects a component in a first sensing direction of the external magnetic field and generates the first detection signal Sx. The first sensing direction corresponds to one of the aforementioned two directions. The component in the first sensing direction of the external magnetic field will hereinafter be referred to as a first external magnetic field component. In the present embodiment, the first detection signal Sx is specifically a signal corresponding to the strength Bx of the first external magnetic field component.

The second magnetic sensor 20 detects a component in a second sensing direction of the external magnetic field and generates the second detection signal Sy. The second sensing direction corresponds to the other of the aforementioned two directions. The component in the second sensing direction of the external magnetic field will hereinafter be referred to as a second external magnetic field component. In the present embodiment, the second detection signal Sy is specifically a signal corresponding to the strength By of the second external magnetic field component.

Figure 3:
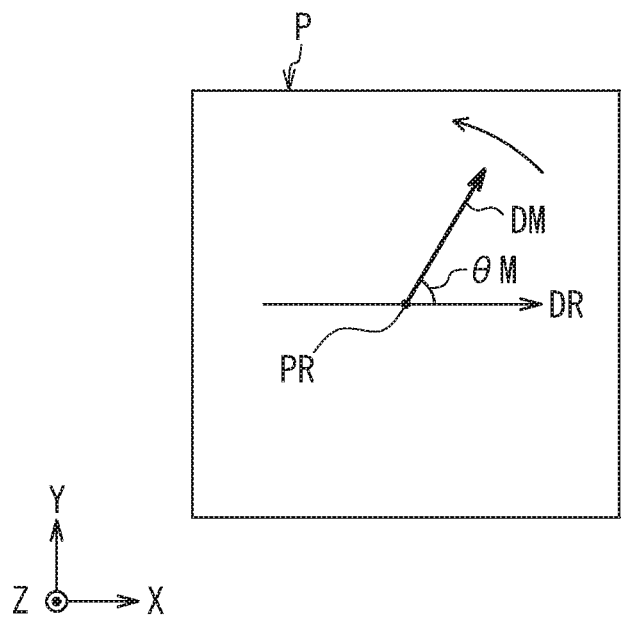
FIG. 3 is an explanatory diagram showing a reference plane for the first embodiment of the invention.

Now, a description will be given of a reference coordinate system and first and second sensor coordinate systems of the present embodiment with reference to FIG. 1 and FIG. 3. The reference coordinate system is a coordinate system that is set with reference to the reference plane P. The first sensor coordinate system is a coordinate system that is set with reference to the first magnetic sensor 10. The second sensor coordinate system is a coordinate system that is set with reference to the second magnetic sensor 20. The first and second sensor coordinate systems will hereinafter be simply referred to as a sensor coordinate system, as a generic term. An X direction, a Y direction, and a Z direction are defined in both of the reference coordinate system and the sensor coordinate system. The X, Y, and Z directions are orthogonal to each other. For both of the reference coordinate system and the sensor coordinate system, the opposite direction to the X direction is defined as the −X direction, and the opposite direction to the Y direction as the −Y direction.

The reference plane P is an imaginary plane parallel to one of opposite end faces of the magnet 6. The reference position PR is a position at which the magnetic sensor device 2 detects the target magnetic field MF. The reference direction DR is in the reference plane P and intersects the reference position PR. The direction DM of the target magnetic field MF at the reference position PR is also in the reference plane P. The magnetic sensor device 2 is disposed to face the aforementioned one of opposite end faces of the magnet 6.

The Z direction of the reference coordinate system is a direction parallel to the center of rotation C shown in FIG. 1 and directed from bottom to top in FIG. 1. The Z direction of the reference coordinate system is perpendicular to the reference plane P. The X and Y directions of the reference coordinate system are two directions perpendicular to the Z direction of the reference coordinate system and orthogonal to each other.

In the present embodiment, the reference direction DR is the X direction of the reference coordinate system. In the reference plane P, the direction DM of the target magnetic field MF rotates around the reference position PR. The target magnetic field angle θM is expressed as a positive value when viewed counterclockwise from the reference direction DR in FIG. 3, and as a negative value when viewed clockwise from the reference direction DR in FIG. 3.

The magnetic sensor device 2 is designed so that the first and second sensor coordinate systems coincide with the reference coordinate system. However, at least one of the first sensor coordinate system or the second sensor coordinate system can deviate from the reference coordinate system due to reasons such as misalignment between the first and second magnetic sensors 10 and 20.

In the present embodiment, the first sensing direction is a direction parallel to the X direction of the first sensor coordinate system, and the second sensing direction is a direction parallel to the Y direction of the second sensor coordinate system. Hereinafter, a direction parallel to the X direction of the reference coordinate system will be referred to as a first main-axis direction, and a direction parallel to the Y direction of the reference coordinate system will be referred to as a second main-axis direction. Ideally, the first sensing direction should coincide with the first main-axis direction, and the second sensing direction should coincide with the second main-axis direction. However, the first sensing direction may deviate from the first main-axis direction or the second sensing direction may deviate from the second main-axis direction due to, for example, misalignment of at least one of the first magnetic sensor 10 or the second magnetic sensor 20 with the magnet 6.

Hereinafter, unless otherwise specified, the X, Y, and Z directions shown in the drawings shall apply to both of the reference coordinate system and the sensor coordinate system.

Figure 4:
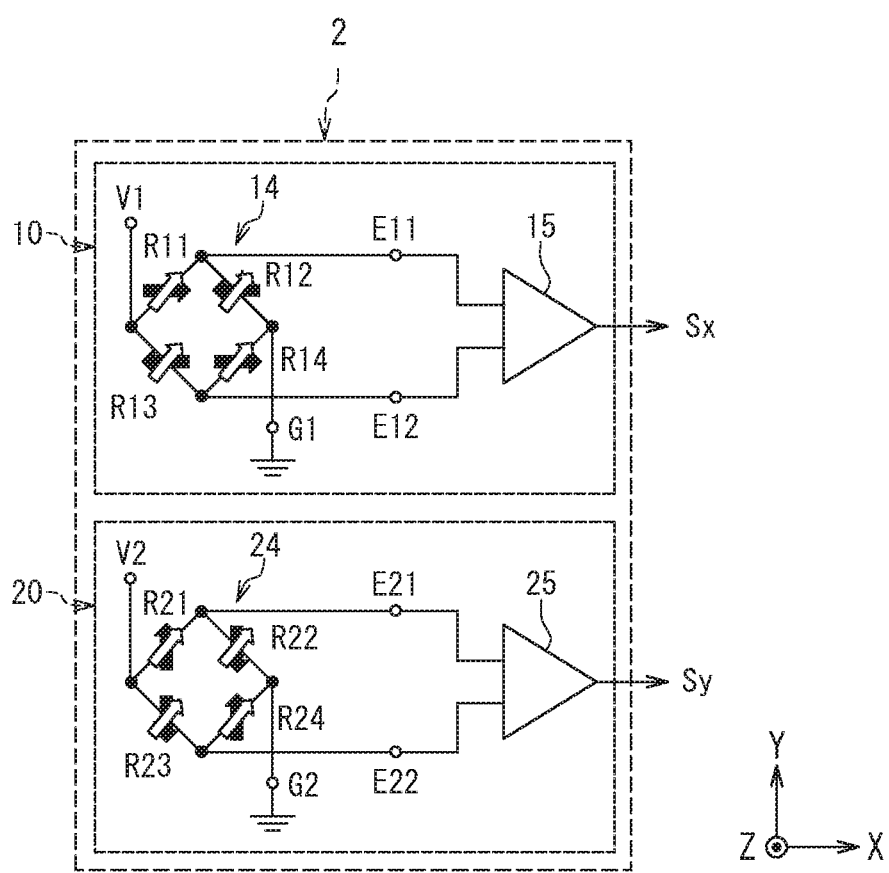
FIG. 4 is a circuit diagram showing a configuration of the magnetic sensor device of the first embodiment of the invention.

Next, a configuration of the magnetic sensor device 2 will be described with reference to FIG. 4. As shown in FIG. 4, the first magnetic sensor 10 includes a Wheatstone bridge circuit 14 and a difference detector 15. The Wheatstone bridge circuit 14 includes four magnetic detection elements R11, R12, R13 and R14, a power supply port V1, a ground port G1, and two output ports E11 and E12. The magnetic detection element R11 is provided between the power supply port V1 and the output port E11. The magnetic detection element R12 is provided between the output port E11 and the ground port G1. The magnetic detection element R13 is provided between the power supply port V1 and the output port E12. The magnetic detection element R14 is provided between the output port E12 and the ground port G1. A power supply voltage of predetermined magnitude is applied to the power supply port V1. The ground port G1 is connected to ground. The difference detector 15 outputs a signal corresponding to a potential difference between the output ports E11 and E12 as the first detection signal Sx. The first detection signal Sx may be one obtained by adjusting the amplitude or offset of the potential difference between the output ports E11 and E12.

The second magnetic sensor 20 includes a Wheatstone bridge circuit 24 and a difference detector 25. The Wheatstone bridge circuit 24 includes four magnetic detection elements R21, R22, R23 and R24, a power supply port V2, a ground port G2, and two output ports E21 and E22. The magnetic detection element R21 is provided between the power supply port V2 and the output port E21. The magnetic detection element R22 is provided between the output port E21 and the ground port G2. The magnetic detection element R23 is provided between the power supply port V2 and the output port E22. The magnetic detection element R24 is provided between the output port E22 and the ground port G2. A power supply voltage of predetermined magnitude is applied to the power supply port V2. The ground port G2 is connected to ground. The difference detector 25 outputs a signal corresponding to a potential difference between the output ports E21 and E22 as the second detection signal Sy. The second detection signal Sy may be one obtained by adjusting the amplitude or offset of the potential difference between the output ports E21 and E22.

Hereinafter, the magnetic detection elements R11 to R14 and R21 to R24 will be simply referred to as a magnetic detection element R, as a generic term. The magnetic detection element R may include a plurality of magnetoresistive (MR) elements connected in series. Each of the plurality of MR elements is a spin-valve MR element, for example. The spin-valve MR element includes a magnetization pinned layer whose magnetization direction is pinned, a free layer which is a magnetic layer whose magnetization direction varies depending on an external magnetic field, and a gap layer located between the magnetization pinned layer and the free layer. The spin-valve MR element may be a tunneling magnetoresistive (TMR) element or a giant magnetoresistive (GMR) element. In the TMR element, the gap layer is a tunnel barrier layer. In the GMR element, the gap layer is a nonmagnetic conductive layer. The resistance of the spin-valve MR element varies depending on the angle that the magnetization direction of the free layer forms with respect to the magnetization direction of the magnetization pinned layer. The resistance of the spin-valve MR element is at its minimum value when the foregoing angle is 0°, and at its maximum value when the foregoing angle is 180°. In FIG. 4, the filled arrows indicate the magnetization directions of the magnetization pinned layers of the MR elements, and the hollow arrows indicate the magnetization directions of the free layers of the MR elements. In each MR element, the free layer has a uniaxial magnetic anisotropy that sets the direction of the magnetization easy axis to be orthogonal to the magnetization direction of the magnetization pinned layer. The uniaxial magnetic anisotropy may be shape magnetic anisotropy.

In the first magnetic sensor 10, the magnetization pinned layers of the MR elements included in the magnetic detection elements R11 and R14 are magnetized in the X direction of the first sensor coordinate system, and the magnetization pinned layers of the MR elements included in the magnetic detection elements R12 and R13 are magnetized in the −X direction of the first sensor coordinate system. In the MR elements in the first magnetic sensor 10, the angle that the magnetization direction of the free layer forms with respect to the magnetization direction of the magnetization pinned layer varies depending on the strength Bx of the first external magnetic field component. As a result, the first detection signal Sx varies depending on the strength Bx.

In the second magnetic sensor 20, the magnetization pinned layers of the MR elements included in the magnetic detection elements R21 and R24 are magnetized in the Y direction of the second sensor coordinate system, and the magnetization pinned layers of the MR elements included in the magnetic detection elements R22 and R23 are magnetized in the −Y direction of the second sensor coordinate system. In the MR elements in the second magnetic sensor 20, the angle that the magnetization direction of the free layer forms with respect to the magnetization direction of the magnetization pinned layer varies depending on the strength By of the second external magnetic field component. As a result, the second detection signal Sy varies depending on the strength By.

In the light of the production accuracy of the MR elements or other factors, the magnetization directions of the magnetization pinned layers of the MR elements in the magnetic sensors 10 and 20 can deviate from the desired directions described above.

An example configuration of the MR elements will now be described with reference to FIG. 5. The MR elements are formed on a substrate (not shown). The MR element 100 shown in FIG. 5 includes an antiferromagnetic layer 101, a magnetization pinned layer 102, a gap layer 103, and a free layer 104 which are stacked in this order, from closest to farthest from the substrate. The antiferromagnetic layer 101 is formed of an antiferromagnetic material, and is in exchange coupling with the magnetization pinned layer 102 to thereby pin the magnetization direction of the magnetization pinned layer 102.

Figure 5:
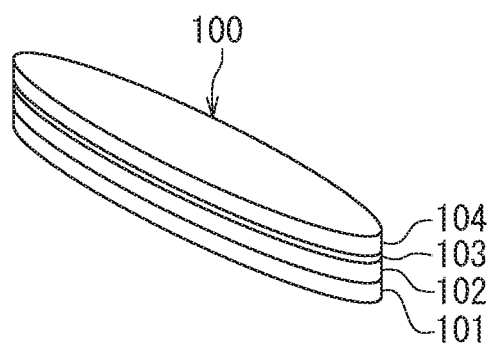
FIG. 5 is a perspective view showing a magnetoresistive element of the first embodiment of the invention.

The layers 101 to 104 of the MR element 100 may be stacked in the reverse order to that shown in FIG. 5. The magnetization pinned layer 102 need not necessarily be a single ferromagnetic layer but may have an artificial antiferromagnetic structure including two ferromagnetic layers and a nonmagnetic metal layer interposed between the two ferromagnetic layers. The MR element 100 may be configured without the antiferromagnetic layer 101. The magnetic detection element may be an element for detecting a magnetic field other than the MR element, such as a Hall element or a magnetic impedance element.

Figure 6:
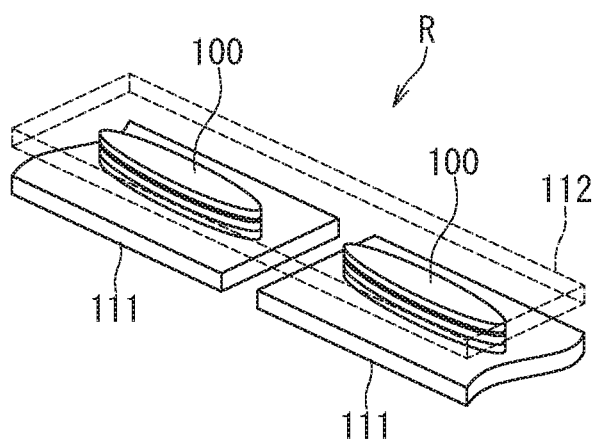
FIG. 6 is a perspective view showing part of a resistor section of the first embodiment of the invention.

Next, an example configuration of the magnetic detection element R will be described with reference to FIG. 6. In this example, the magnetic detection element R includes a plurality of MR elements 100 connected in series. The magnetic detection element R further includes one or more connection layers for electrically connecting two MR elements 100 that are adjacent to each other in circuit configuration, so that the plurality of MR elements 100 are connected in series. In the example shown in FIG. 6 the magnetic detection element R includes, as the one or more connection layers, one or more lower connection layers 111 and one or more upper connection layers 112. The lower connection layer 111 is in contact with the bottom surfaces of two MR elements 100 adjacent to each other in circuit configuration, and electrically connects the two MR elements 100. The upper connection layer 112 is in contact with the top surfaces of two MR elements 100 adjacent to each other in circuit configuration, and electrically connects the two MR elements 100.

Next, a configuration of the signal processing circuit 50 will be described in detail with reference to FIG. 2. The signal processing circuit 50 is constructed of, for example, an application-specific integrated circuit (ASIC) or a microcomputer. The signal processing circuit 50 includes analog-to-digital converters (hereinafter referred to as A/D converters) 51 and 52, a correction processing section 54, a correction function determination section 55, and an angle detection section 56.

The A/D converter 51 converts the first detection signal Sx into digital form. The A/D converter 52 converts the second detection signal Sy into digital form. The correction processing section 54, the correction function determination section 55, and the angle detection section 56 are functional blocks for performing processing described below.

The correction function determination section 55 performs correction function determination processing. In the correction function determination processing, correction functions for correcting the first and second detection signals Sx and Sy converted into digital form by the A/D converters 51 and 52 are determined.

The correction processing section 54 performs correction processing. In the correction processing, the first and second detection signals Sx and Sy converted into digital form by the A/D converters 51 and 52 are corrected using the correction functions to generate first and second corrected signals CSx and CSy.

Figure 7:
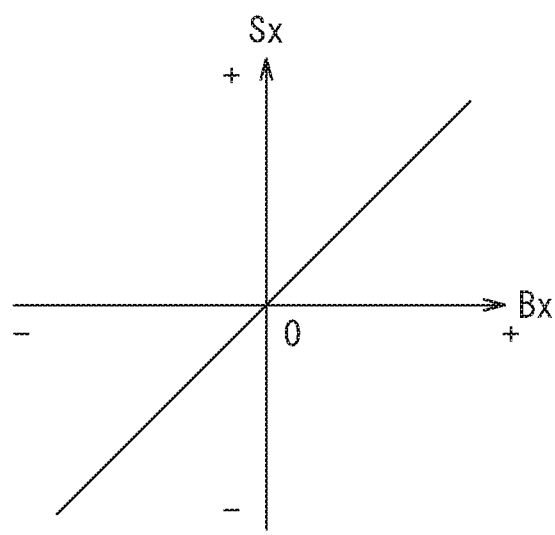
FIG. 7 is a characteristic chart showing an ideal characteristic of a first magnetic sensor of the first embodiment of the invention.

Now, ideal characteristics of the first and second magnetic sensors 10 and 20 of the present embodiment will be described with reference to FIG. 7 and FIG. 8. FIG. 7 is a characteristic chart showing the ideal characteristic of the first magnetic sensor 10. In FIG. 7, the horizontal axis represents the strength Bx of the first external magnetic field component, and the vertical axis represents the first detection signal Sx. In the example shown in FIG. 7, the strength Bx is expressed as a positive value if the first external magnetic field component is in the X direction of the first sensor coordinate system, and as a negative value if the first external magnetic field component is in the −X direction of the first sensor coordinate system. In the example shown in FIG. 7, the first detection signal Sx has a value of 0 if the strength Bx is 0, has a positive value if the strength Bx has a positive value, and has a negative value if the strength Bx has a negative value. The value of the first detection signal Sx increases as the strength Bx increases. Ideally, as shown in FIG. 7, the first detection signal Sx generated by the first magnetic sensor 10 is proportional to the strength Bx of the first external magnetic field component.

Figure 8:
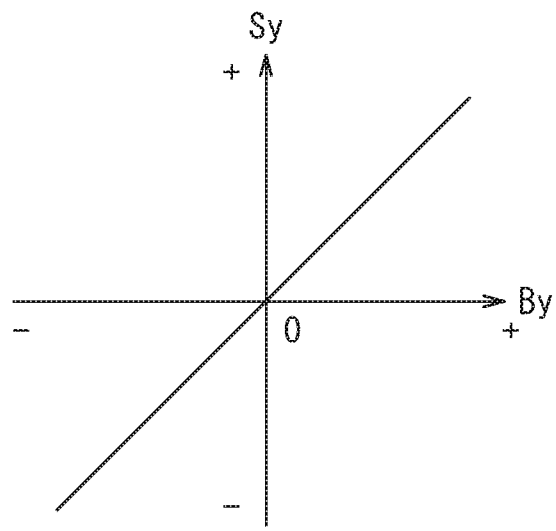
FIG. 8 is a characteristic chart showing an ideal characteristic of a second magnetic sensor of the first embodiment of the invention.

FIG. 8 is a characteristic chart showing the ideal characteristic of the second magnetic sensor 20. In FIG. 8, the horizontal axis represents the strength By of the second external magnetic field component, and the vertical axis represents the second detection signal Sy. In the example shown in FIG. 8, the strength By is expressed as a positive value if the second external magnetic field component is in the Y direction of the second sensor coordinate system, and as a negative value if the second external magnetic field component is in the −Y direction of the second sensor coordinate system. In the example shown in FIG. 8, the second detection signal Sy has a value of 0 if the strength By is 0, has a positive value if the strength By has a positive value, and has a negative value if the strength By has a negative value. The value of the second detection signal Sy increases as the strength By increases. Ideally, as shown in FIG. 8, the second detection signal Sy generated by the second magnetic sensor 20 is proportional to the strength By of the second external magnetic field component. Ideally, the ratio of a change in the second detection signal Sy to a change in the strength By is equal to the ratio of a change in the first detection signal Sx to a change in the strength Bx.

Ideally, the first and second sensor coordinate systems coincide with the reference coordinate system. Furthermore, ideally, the first detection signal Sx is independent of the strength By, and the second detection signal Sy is independent of the strength Bx.

The ideal state described above makes it possible to determine the angle detection value $\theta s$ by the following Eq. (1).

$$\theta s = \mathrm{atan}(Sy/Sx) \qquad (1)$$

Note that "atan" represents an arctangent.

For $\theta s$ ranging from 0° to less than 360°, Eq. (1) yields two solutions of $\theta s$ that are 180° different in value. Which of the two solutions of $\theta s$ in Eq. (1) is the true value of $\theta s$ can be determined in accordance with the combination of the signs of Sx and Sy.

However, as will be described in detail later, the presence of cross-axis sensitivity can cause an error in at least one of the first detection signal Sx or the second detection signal Sy. An error can thus occur in the angle detection value $\theta s$ if the angle detection value $\theta s$ is determined by Eq. (1). The correction processing is processing to correct the first and second detection signals Sx and Sy to generate the first and second corrected signals CSx and CSy so that error occurring in the angle detection value $\theta s$ is reduced.

The angle detection section 56 performs processing to generate the angle detection value $\theta s$ based on the first and second corrected signals CSx and CSy. Specifically, the angle detection section 56 generates the angle detection value $\theta s$ by the following Eq. (2).

$$\theta s = \mathrm{atan}(CSy/CSx) \qquad (2)$$

For $\theta s$ ranging from 0° to less than 360°, Eq. (2) yields two solutions of $\theta s$ that are 180° different in value. Which of the two solutions of $\theta s$ in Eq. (2) is the true value of $\theta s$ can be determined in accordance with the combination of the signs of CSx and CSy. The angle detection section 56 determines $\theta s$ within the range of 0° to less than 360° in accordance with Eq. (2) and the determination on the combination of the signs of CSx and CSy.

Next, the correction function determination processing by the correction function determination section 55 and the correction processing by the correction processing section 54 will be described in detail. To begin with, main-axis sensitivity and cross-axis sensitivity will be described. In the present embodiment, the ratio of a change in the first detection signal Sx to a change in the strength of a magnetic field in the first main-axis direction will be referred to as a first main-axis sensitivity. The ratio of a change in the second detection signal Sy to a change in the strength of a magnetic field in the second main-axis direction will be referred to as a second main-axis sensitivity. The ratio of a change in the first detection signal Sx to a change in the strength of a magnetic field in the second main-axis direction will be referred to as a first cross-axis sensitivity. The ratio of a change in the second detection signal Sy to a change in the strength of a magnetic field in the first main-axis direction will be referred to as a second cross-axis sensitivity. Ideally, the first and second cross-axis sensitivities are both 0. However, at least one of the first cross-axis sensitivity or the second cross-axis sensitivity can have a value other than 0. The foregoing phrase "the presence of cross-axis sensitivity" means that at least one of the first cross-axis sensitivity or the second cross-axis sensitivity has a value other than 0. The presence of cross-axis sensitivity can cause an error in at least one of the first detection signal Sx or the second detection signal Sy and consequently cause an error in the angle detection value $\theta s$.

Major causes of the presence of cross-axis sensitivity include the following first to third causes.

The first cause is that the first sensing direction deviates from the first main-axis direction and/or the second sensing direction deviates from the second main-axis direction due to misalignment of at least one of the first magnetic sensor 10 or the second magnetic sensor 20 with the magnet 6.

The second cause is that the magnetization directions of the magnetization pinned layers of the MR elements in the magnetic sensors 10 and 20 deviate from the desired directions.

The third cause relates to the characteristics of the magnetic sensors 10 and 20. A first specific example of the third cause is that, in each MR element in the magnetic sensor 10, the angle that the magnetization direction of the free layer forms with respect to the magnetization direction of the magnetization pinned layer is not determined by only the strength Bx of the first external magnetic field component but varies depending on the strength By of the second external magnetic field component. A second specific example of the third cause is that, in each MR element in the magnetic sensor 20, the angle that the magnetization direction of the free layer forms with respect to the magnetization direction of the magnetization pinned layer is not determined by only the strength By of the second external magnetic field component but varies depending on the strength Bx of the first external magnetic field component.

The correction processing corrects the first and second detection signals Sx and Sy to generate the first and second corrected signals CSx and CSy so that error occurring in the angle detection value θs due to the presence of cross-axis sensitivity is reduced.

The correction function is expressed as a 2×2 coefficient matrix MC for converting a first column vector VS containing the first and second detection signals Sx and Sy as elements into a second column vector VCS containing the first and second corrected signals CSx and CSy as elements. The coefficient matrix MC contains a correction coefficient $C_{ij}$ as an ith-row jth-column component, where i and j are integers that are each 1 or greater and not greater than 2.

In the coefficient matrix MC, two correction coefficients $C_{11}$ and $C_{22}$ where i and j have the same value contribute to correction related to the main-axis sensitivity. On the other hand, two correction coefficients $C_{12}$ and $C_{21}$ where i and j have different values contribute to correction related to the cross-axis sensitivity. The correction processing performs only correction related to the cross-axis sensitivity, and no correction related to the main-axis sensitivity. Therefore, in the present embodiment, the correction coefficient $C_{11}$ and the correction coefficient $C_{22}$ in the coefficient matrix MC are set to the same value, specifically, 1. In this case, the correction function is given by the following Eq. (3). The correction related to the cross-axis sensitivity will hereinafter be referred to as cross-axis sensitivity correction.

$$\begin{pmatrix} CSx \\ CSy \end{pmatrix} = \begin{pmatrix} 1 & C_{12} \\ C_{21} & 1 \end{pmatrix} \begin{pmatrix} Sx \\ Sy \end{pmatrix} \quad (3)$$

The column vector on the right side of Eq. (3) is the first column vector VS. The 2×2 matrix on the right side of Eq. (3) is the coefficient matrix MC. The column vector on the left side of Eq. (3) is the second column vector VCS.

In the signal processing circuit 50, a provisional correction function is defined for the correction function determination processing. The provisional correction function is a function containing one or two provisional correction coefficients $C_{13}$ where i and j have different values.

The provisional correction function can be regarded as simultaneous equations with two unknowns, with the one or more provisional correction coefficients as a variable or variables. In such a case, if the number of the provisional correction coefficients is one or greater and not greater than two, the provisional correction coefficient(s) is/are identifiable. If the number of provisional correction coefficients is three or greater, the provisional correction coefficients are not identifiable. In the present embodiment, the correction processing performs no correction related to the main-axis sensitivity. Thus, the two correction coefficients $C_{11}$ and $C_{22}$ contributing to the correction related to the main-axis sensitivity are set to 1, and one or both of the two correction coefficients $C_{12}$ and $C_{21}$ contributing to the correction related to the cross-axis sensitivity is/are assumed as the one or two provisional correction coefficients.

The number of the one or two provisional correction coefficients may be one. For example, to ensure orthogonality between the X and Y directions in the sensor coordinate system without correcting misalignment between the sensor coordinate system and the reference coordinate system, one of the correction coefficients $C_{12}$ and $C_{21}$ may be set to 0 and the other may be assumed as the provisional correction coefficient.

The correction function determination processing includes obtaining a plurality of pairs of values of the first and second detection signals Sx and Sy and performing arithmetic processing using the plurality of pairs of values of the first and second detection signals Sx and Sy to determine the one or two provisional correction coefficients as the correction coefficient $C_{ij}$ contained in the coefficient matrix MC representing the correction function. Such arithmetic processing will be referred to as correction-coefficient determination processing.

In the present embodiment, first and second provisional corrected signal values PCSx and PCSy, a provisional measurement value, a target value, and a measurement value error are defined for the correction function determination processing, in addition to the provisional correction function.

The first and second provisional corrected signal values PCSx and PCSy are values of the first and second corrected signals determined from the values of the first and second detection signals Sx and Sy by using the provisional correction function.

The provisional measurement value is defined based on the first and second provisional corrected signal values PCSx and PCSy. The provisional measurement value may be a first- or second-example provisional measurement value. The first-example provisional measurement value is the sum of squares of the first and second provisional corrected signal values PCSx and PCSy. The second-example provisional measurement value is the square root of the sum of the squares of the first and second provisional corrected signal values PCSx and PCSy.

The target value is a target value for the provisional measurement value. The target value for the first-example provisional measurement value will hereinafter be referred to as a first-example target value. The target value for the second-example provisional measurement value will be referred to as a second-example target value. Here, the values of the first and second detection signals Sx and Sy obtained on the assumption that the external magnetic field has a constant strength and the first and second magnetic sensors 10 and 20 have the ideal characteristics shown in FIGS. 7 and 8 will be referred to as first and second ideal detection signal values, respectively. The first-example target value is the sum of squares of the first and second ideal detection signal values. The second-example target value is the square root of the sum of the squares of the first and second ideal detection signal values.

Figure 9:
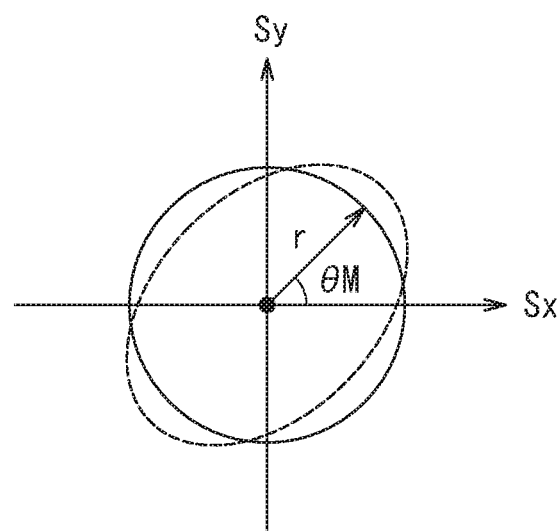
FIG. 9 is an explanatory diagram for describing correction processing of the first embodiment of the invention.

Now, an example of a relationship between the first and second ideal detection signal values and the values of the first and second detection signals Sx and Sy in the presence of cross-axis sensitivity will be described with reference to FIG. 9. FIG. 9 shows an orthogonal coordinate system defined by two axes for indicating the values of the first and second detection signals Sx and Sy. In this orthogonal coordinate system, a locus of coordinates (Sx, Sy) representing a pair of values of the first and second detection signals Sx and Sy in the presence of cross-axis sensitivity does not trace a circle, as shown by the broken line. On the other hand, a locus of the coordinates representing a pair of first and second ideal detection signal values traces a circle as shown by the solid line. In FIG. 9, a point on the circle at the tip of the arrow pointing to the circle from the origin point corresponds to the coordinates representing the pair of the first and second ideal detection signal values when the target magnetic field angle θM has a certain value. The radius r of the circle shown in FIG. 9 is the second-example target value. The square of the radius r is the first-example target value.

The measurement value error is the square of a difference between the provisional measurement value and the target value. Hereinafter, the square of a difference between the first-example provisional measurement value and the first-example target value will hereinafter be referred to as a first-example measurement value error. The square of a difference between the second-example provisional measurement value and the second-example target value will be referred to as a second-example measurement value error.

The total sum of a plurality of measurement value errors obtained for the plurality of pairs of values of the first and second detection signals Sx and Sy will be denoted by the symbol E. In the present embodiment, the correction function determination processing includes maintaining the target value and performing, as the correction-coefficient determination processing, arithmetic processing to determine the value(s) of the one or two provisional correction coefficients that minimize(s) the total sum E. Such arithmetic processing can be said to be one using the least squares method.

In the correction function determination processing, based on the value(s) of the provisional correction coefficient(s) determined as described above, the provisional correction coefficient(s) is/are determined as the correction coefficient $C_{ij}$ contained in the coefficient matrix MC representing the correction function. The correction function is thereby determined.

Figure 10:
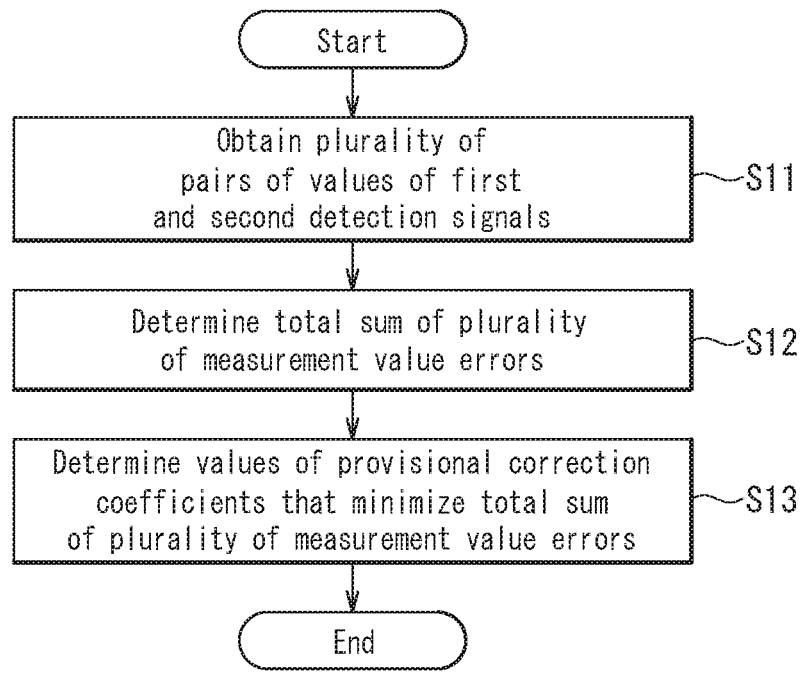
FIG. 10 is a flowchart of correction function determination processing of the first embodiment of the invention.

Now, the correction function determination processing will be concretely described with reference to FIG. 10. By way of example, the following description deals with a case where two correction coefficients $C_{12}$ and $C_{21}$ are assumed to be the provisional correction coefficients. FIG. 10 is a flowchart of the correction function determination processing. In the correction function determination processing, a plurality of pairs of values of the first and second detection signals Sx and Sy are obtained first (step S11).

Next, the total sum E of a plurality of measurement value errors obtained for the plurality of pairs of values of the first and second detection signals Sx and Sy is determined (step S12). In the present embodiment, as described above, the correction function is expressed by Eq. (3). From Eq. (3), the first and second provisional corrected signal values PCSx and PCSy are given by the following Eqs. (4) and (5), respectively.

$$PCSx = Sx + C_{12} \cdot Sy \quad (4)$$

$$PCSy = C_{21} \cdot Sx + Sy \quad (5)$$

Therefore, the total sum E of a plurality of first-example measurement value errors is given by the following Eq. (6).

$$E = \sum \left[ PCSx^2 + PCSy^2 - r^2 \right]^2 \quad (6)$$
$$= \sum \left[ (Sx + C_{12} \cdot Sy)^2 + (C_{21} \cdot Sx + Sy)^2 - r^2 \right]^2$$

The total sum E of a plurality of second-example measurement value errors is given by the following Eq. (7).

$$E = \sum \left[ \sqrt{(PCSx^2 + PCSy^2)} - r \right]^2 \quad (7)$$
$$= \sum \left[ \sqrt{((Sx + C_{12} \cdot Sy)^2 + (C_{21} \cdot Sx + Sy)^2)} - r \right]^2$$

The correction function determination processing then proceeds to determining values of the provisional correction functions $C_{12}$ and $C_{21}$ that minimize the total sum E (step S13).

Examples of the method of determining the values of the correction coefficients $C_{12}$ and $C_{21}$ that minimize the total sum E include the following first and second methods. The first method is to determine values that simultaneously satisfy two equations: $\partial E/\partial C_{12}=0$ and $\partial E/\partial C_{21}=0$. The two equations are obtained by partially differentiating the total sum E by the correction coefficients $C_{12}$ and $C_{21}$, respectively. The second method is to search for solutions by an iterative method, i.e., iterative computations.

In the present embodiment, values of the correction coefficients $C_{12}$ and $C_{21}$ that minimize the total sum E can be determined each time a pair of values of the first and second detection signals Sx and Sy is obtained. However, if the correction function is updated upon each acquisition of the values of the correction coefficients $C_{12}$ and $C_{21}$, the first and second corrected signals CSx and CSy can vary with variations in the correction coefficients $C_{12}$ and $C_{21}$. In view of this, in the correction function determination processing and the correction processing, the correction function may be updated with the values of the correction coefficients $C_{12}$ and $C_{21}$ when the respective values of the correction coefficients $C_{12}$ and $C_{21}$ have converged.

To determine that the values of the correction coefficients $C_{12}$ and $C_{21}$ have converged, the following method can be used, for example. Initially, a first waveform representing a temporal change in the value of one of the correction coefficients and a second waveform representing a temporal change in a time derivative value of the first waveform are recognized. The time derivative value is a value obtained by subtracting the previous value of the correction coefficient from the current value of the correction coefficient. Next, the values of the correction coefficient at points in time when the sign of the time derivative value represented by the second waveform changes from positive to negative or negative to positive are successively stored as peak values. Each time a new peak value is obtained, the absolute value of the current peak value minus the previous peak value is stored one by one as an amplitude value. When the amplitude value falls to or below a predetermined value, the value of the one correction coefficient is determined to have converged.

The first and second corrected signals CSx and CSy are generated by the correction function determination processing and the correction processing described above. In the orthogonal coordinate system shown in FIG. 9, the locus of the coordinates (CSx, CSy) representing a pair of values of the first and second corrected signals CSx and CSy is closer to the locus of the coordinates representing the pair of first and second ideal detection signal values shown by the solid line than the locus of the coordinates (Sx, Sy) shown by the broken line. Therefore, an error occurring in the angle detection value θs is reduced by generating the angle detection value θs in accordance with Eq. (2) using the first and second corrected signals CSx and CSy, compared to a case where the angle detection value θs is generated in accordance with Eq. (1) using the first and second detection signals Sx and Sy.

In the signal processing circuit 50 and the magnetic sensor system 1 according to the present embodiment, arithmetic processing using a plurality of pairs of values the first and second detection signals Sx and Sy is performed in the correction function determination processing to thereby determine one or two provisional correction coefficients as the correction coefficient $C_{ij}$ contained in the coefficient matrix MC representing the correction function. The present embodiment thus makes it possible to determine the correction function for implementing cross-axis sensitivity correction for at least one of the magnetic sensor 10 or the magnetic sensor 20 without necessitating a device for generating a dedicated magnetic field and without necessitating interruption of a normal operation of the magnetic sensors 10 and 20.

Second Embodiment

A second embodiment of the present invention will now be described. First, an overview of a magnetic sensor system according to the present embodiment will be described with reference to FIG. 11 and FIG. 12. The magnetic sensor system 70 according to the present embodiment is configured to detect the position of an object that is movable linearly.

Figure 11:
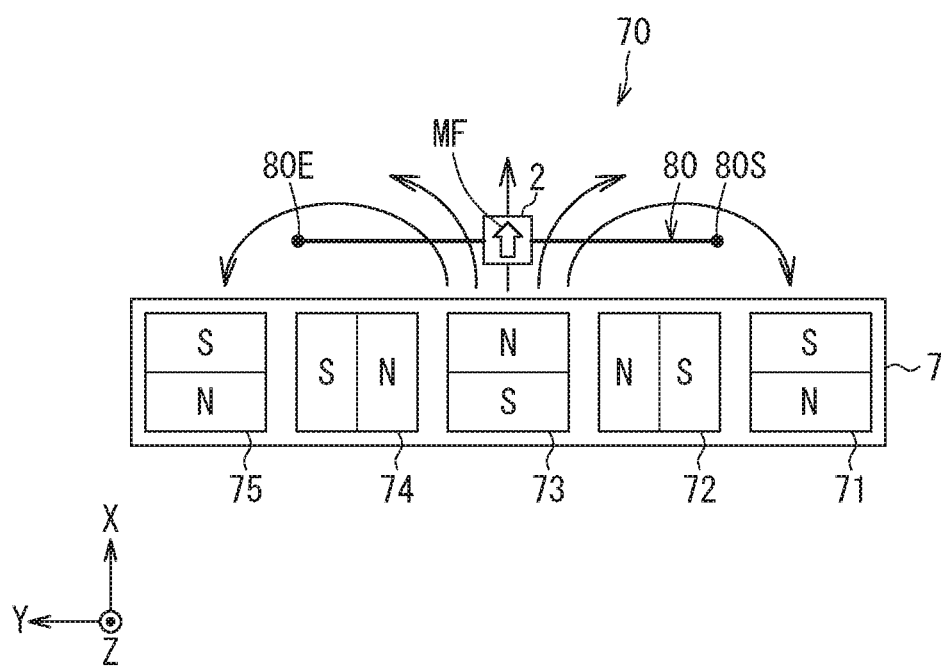
FIG. 11 is a plan view showing a target magnetic field generator and a magnetic sensor device of a second embodiment of the invention.
Figure 12:
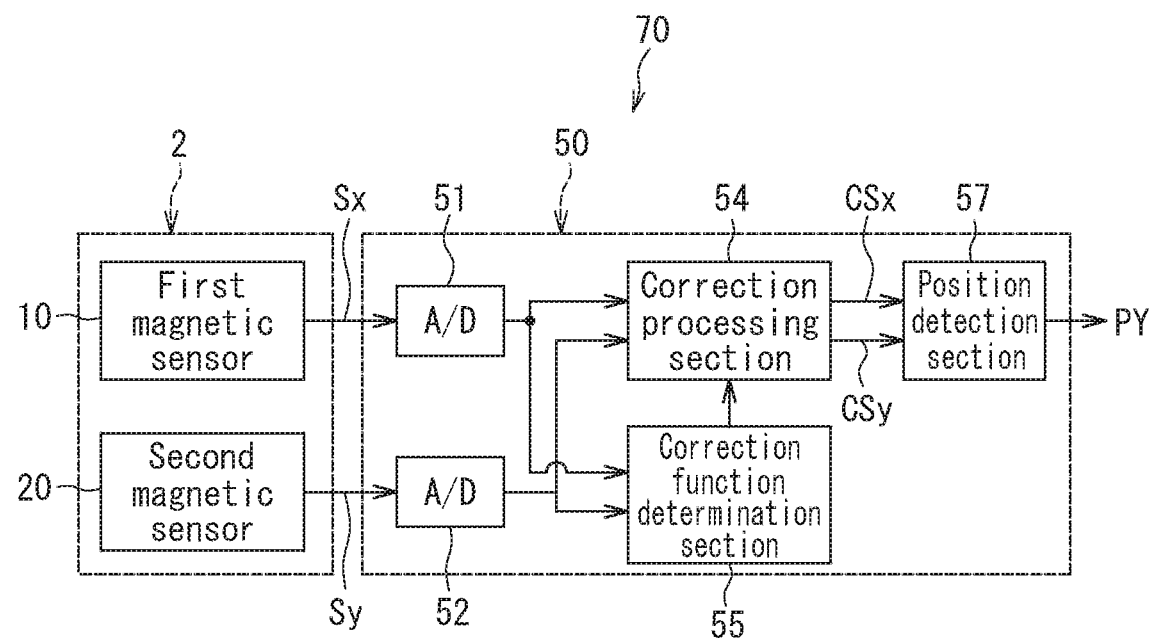
FIG. 12 is a block diagram showing a configuration of a magnetic sensor system according to the second embodiment of the invention.

As shown in FIG. 12, the magnetic sensor system 70 includes a magnetic sensor device 2 and a signal processing circuit 50. As shown in FIG. 11, the magnetic sensor system 70 further includes a target magnetic field generator 7.

The target magnetic field generator 7 includes a Halbach array of five magnets 71, 72, 73, 74, and 75. The five magnets 71, 72, 73, 74, and 75 are arranged in this order in the Y direction of the reference coordinate system. Each of the magnets 71 to 75 has an N pole and an S pole. Each of the magnets 71 to 75 is magnetized in the direction from the S pole to the N pole inside the magnet.

The magnet 71 is magnetized in the −X direction. The magnet 72 is magnetized in the Y direction. The magnet 73 is magnetized in the X direction. The magnet 74 is magnetized in the −Y direction. The magnet 75 is magnetized in the −X direction.

The magnetic sensor device 2 is located forward of the target magnetic field generator 7 in the X direction and configured to move in the Y direction along with the movement of the object. In FIG. 11, the line segment designated by the reference numeral 80 represents the movable range of the magnetic sensor device 2. The point designated by the reference sign 80S represents one end of the movable range 80, and the point designated by the reference sign 80E represents the other end of the movable range 80.

The target magnetic field generator 7 generates a magnetic field. In FIG. 11, the arrowed straight line and the arrowed curves drawn near the target magnetic field generator 7 represent magnetic lines of force corresponding to the magnetic field generated by the target magnetic field generator 7. If the magnetic sensor device 2 changes its position within the movable range 80, the magnetic field that is generated by the target magnetic field generator 7 and received by the magnetic sensor device 2 changes direction. In the present embodiment, the magnetic field that is generated by the target magnetic field generator 7 and received by the magnetic sensor device 2 is the target magnetic field MF. It is possible to detect the position of the magnetic sensor device 2 by detecting the direction of the target magnetic field MF using the magnetic sensor device 2. This makes it possible to detect the position of the object.

As shown in FIG. 12, the signal processing circuit 50 of the present embodiment includes a position detection section 57 in place of the angle detection section 56 of the signal processing circuit 50 of the first embodiment. Based on the first and second corrected signals CSx and CSy, the position detection section 57 generates a position detection value PY indicating the position of the magnetic sensor device 2.

Figure 13:
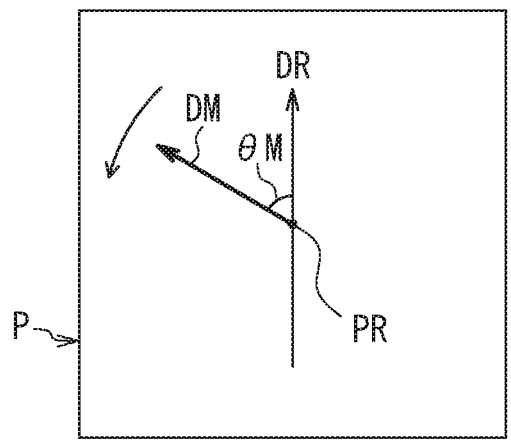
FIG. 13 is an explanatory diagram showing a reference plane for the second embodiment of the invention.
Figure 13:
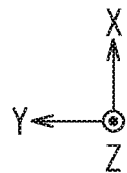

Reference is now made to FIG. 13 to describe a reference plane P, a reference position PR, a reference direction DR, and a target magnetic field angle θM in the present embodiment. The reference plane P in the present embodiment is an XY plane intersecting the magnetic sensor device 2. The reference position PR is a position at which the magnetic sensor device 2 detects the target magnetic field MF. The reference direction DR is in the reference plane P and intersects the reference position PR. The direction DM of the target magnetic field MF at the reference position PR is also in the reference plane P. The target magnetic field angle θM is an angle that the direction of the target magnetic field MF at the reference position PR in the reference plane P forms with respect to the reference direction DR.

In the present embodiment, the reference direction DR is the X direction of the reference coordinate system, as in the first embodiment. In the reference plane P, the direction DM of the target magnetic field MF rotates around the reference position PR. As in the first embodiment, the target magnetic field angle θM is expressed as a positive value when viewed counterclockwise from the reference direction DR in FIG. 13, and as a negative value when viewed clockwise from the reference direction DR in FIG. 13.

Figure 14:
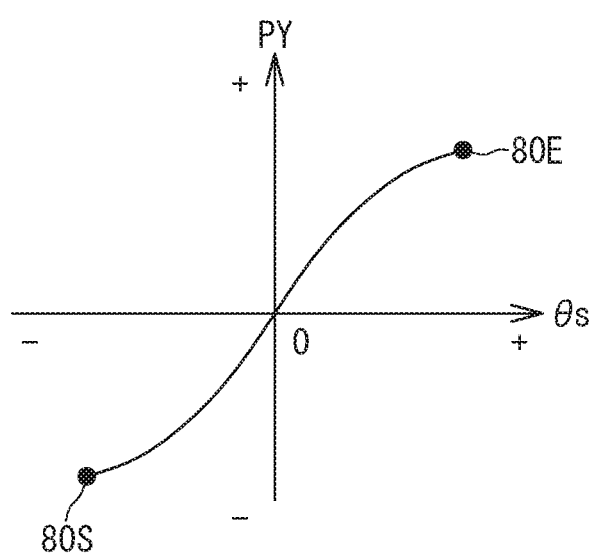
FIG. 14 is a characteristic chart showing a relationship between an angle detection value and a position detection value in the second embodiment of the invention.

In the present embodiment, the target magnetic field angle θM has a correspondence with the position of the magnetic sensor device 2. The position detection section 57 shown in FIG. 12 initially generates an angle detection value θs, which indicates the target magnetic field angle θM, in a manner similar to that in which the angle detection section 56 of the first embodiment does. The position detection section 57 then converts the angle detection value θs into a position detection value PY. FIG. 14 is a characteristic chart showing an example of a relationship between the angle detection value θs and the position detection value PY. In FIG. 14 the horizontal axis represents the angle detection value θs, and the vertical axis represents the position detection value PY. In FIG. 14 the point designated by the reference sign 80S corresponds to the end 80S of the movable range 80 in FIG. 11, and the point designated by the reference sign 80E corresponds to the other end 80E of the movable range 80 in FIG. 11. In the example shown in FIG. 14, the position detection value PY is 0 when the angle detection value θs is 0, has a positive value when the angle detection value θs has a positive value, has a negative value when the angle detection value θs has a negative value, and increases as the angle detection value θs increases.

The position detection section 57 stores information indicating a relationship between the angle detection value θs and the position detection value PY such as one shown in FIG. 14, and converts the angle detection value θs into the position detection value PY based on the information.

The configuration of the signal processing circuit 50 in the present embodiment is otherwise the same as that of the signal processing circuit 50 in the first embodiment. The magnetic sensor device 2 in the present embodiment has the same configuration as that in the first embodiment.

In the present embodiment, the angle detection value θs is generated by using the first and second corrected signals CSx and CSy as in the first embodiment. This makes it possible to reduce an error occurring in the angle detection value θs, compared to the case where the angle detection value θs is generated by using the first and second detection signals Sx and Sy. As a result, the present embodiment makes it possible to reduce an error occurring in the position detection value PY, compared to the case where the position detection value PY is generated by using the first and second detection signals Sx and Sy.

The configuration, operation and effects of the present embodiment are otherwise the same as those of the first embodiment.

The present invention is not limited to the foregoing embodiments, and various modifications may be made thereto. For example, in the magnetic sensor system of the present invention, the magnetic sensor device may include first to third magnetic sensors that respectively generate first to third detection signals having correspondences with components of an external magnetic field that are in three mutually different directions. The signal processing circuit of the present invention may be configured to process the first to third detection signals. In such a case, the correction function may be one expressed as a coefficient matrix that is a matrix for converting a first column vector containing the first to third detection signals as elements into a second column vector containing first to third corrected signals as elements. In such a case, the coefficient matrix contains a correction coefficient $C_{ij}$ as an ith-row jth-column component, where i and j are integers that are each 1 or greater and not greater than 3. The provisional correction function may be a function containing one or more and not more than three provisional correction coefficients $C_{ij}$ where i and j have different values. The correction function determination processing may include obtaining a plurality of sets of values of the first to third detection signals, and performing arithmetic processing using the plurality of sets of values of the first to third detection signals to determine the one or more and not more than three provisional correction coefficients as the correction coefficient $C_{ij}$ contained in the foregoing coefficient matrix.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A signal processing circuit configured to process a first detection signal and a second detection signal, the first detection signal and the second detection signal being generated by a magnetic sensor device and having correspondences with components of an external magnetic field that are in two mutually different directions,
the signal processing circuit being configured to:
   obtain a plurality of pairs of values of the first and second detection signals;
   perform correction function determination processing to determine a correction function by performing arithmetic processing using a plurality of pairs of values of the first and second detection signals to determine one of a correction coefficient $C_{12}$ and a correction coefficient $C_{21}$, the correction function being a function for correcting the first and second detection signal, the correction function being expressed as a coefficient matrix that is a matrix for converting a first column vector containing the first and second detection signals as elements into a second column vector containing the first and second corrected signals as elements, the coefficient matrix containing the correction coefficients $C_{12}$, $C_{21}$ and correction coefficients $C_{11}$, $C_{22}$, the correction coefficients $C_{11}$, $C_{12}$, $C_{21}$, $C_{21}$ being a first-row first-column component, a first-row second-column component, a second-row first-column component, and a second-row second-column component, respectively, of the coefficient matrix, the correction coefficient $C_{11}$ and the correction coefficient $C_{22}$ having a same value, and one of the correction coefficient $C_{12}$ and the correction coefficient $C_{21}$ being zero;
   perform correction processing to correct the first and second detection signals by using the correction function to thereby generate first and second corrected signals;
   generate a detection value based on the first and second corrected signals; and
   output the detection value.

2. The signal processing circuit according to claim 1, wherein
a provisional correction function, first and second provisional corrected signal values, a provisional measurement value, a target value, and a measurement value error are defined for the correction function determination processing,
the provisional correction function is a function containing a provisional correction coefficient, the provisional correction coefficient corresponding to one from among the correction coefficient $C_{12}$ and the correction coefficient $C_{21}$ that is not zero,
the first and second provisional corrected signal values are values of the first and second corrected signals determined from values of the first and second detection signals by using the provisional correction function,
the provisional measurement value is a sum of squares of the first and second provisional corrected signal values or a square root of the sum of the squares of the first and second provisional corrected signal values,
the target value is a target value for the provisional measurement value,
the measurement value error is a square of a difference between the provisional measurement value and the target value, and
the correction function determination processing includes maintaining the target value and performing, as the arithmetic processing using the plurality of pairs of values of the first and second detection signals, arithmetic processing to determine a value of the provisional correction coefficient that minimizes a total sum of a plurality of measurement value errors obtained for the plurality of pairs of values of the first and second detection signals.

3. A magnetic sensor system comprising the signal processing circuit of claim 1 and a magnetic sensor device, the magnetic sensor device including:
   a first magnetic sensor for generating the first detection signal, and
   a second magnetic sensor for generating the second detection signal.

* * * * *